United States Patent
Kumar et al.

(10) Patent No.: US 8,816,473 B2
(45) Date of Patent: Aug. 26, 2014

(54) PLANAR POLYSILICON REGIONS FOR PRECISION RESISTORS AND ELECTRICAL FUSES AND METHOD OF FABRICATION

(75) Inventors: Arvind Kumar, Hopewell Junction, NY (US); Anthony I-Chih Chou, Hopewell Junction, NY (US); Renee T. Mo, Hopewell Junction, NY (US); Shreesh Narasimha, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 13/440,172

(22) Filed: Apr. 5, 2012

(65) Prior Publication Data

US 2013/0264679 A1 Oct. 10, 2013

(51) Int. Cl.
*H01L 29/86* (2006.01)
*H01L 21/02* (2006.01)

(52) U.S. Cl.
USPC ............ 257/529; 257/E21.004; 257/E29.325; 438/382

(58) Field of Classification Search
CPC ......... H01L 21/02; H01L 21/84; H01L 29/00; H01L 29/86
USPC ......... 257/350, 358, 364, 379, 380, 382, 489, 257/505, 516, 523, 528, 533, 535–538, 257/540–543, 550, 571–572, 577, 580–582, 257/624, 656, 659, 661, 662, 767, E21.004, 257/E21.026, E21.148, E21.259, E21.294, 257/E21.35, E21.351, E21.363, E21.492, 257/E21.495, E21.531, E21.591, E23.071; 438/2, 91, 141, 160, 171, 190, 210, 438/238, 329, 330–332, 354, 380–385, 403, 438/478, 725, 734, 934, 948–949, 951, 953, 438/979

See application file for complete search history.

(56) References Cited

U.S. PATENT DOCUMENTS

| | | | |
|---|---|---|---|
| 5,424,239 A | 6/1995 | Sweeney | |
| 5,726,084 A | 3/1998 | Boyd et al. | |
| 5,773,871 A | 6/1998 | Boyd et al. | |
| 6,406,952 B2 | 6/2002 | Bevk | |
| 7,303,981 B2 | 12/2007 | Hsu et al. | |
| 7,476,601 B2 | 1/2009 | Chao et al. | |
| 7,595,535 B2 | 9/2009 | Sung | |
| 7,994,576 B2 | 8/2011 | Tseng et al. | |
| 8,012,873 B1 | 9/2011 | Eib | |
| 2004/0222486 A1* | 11/2004 | Ellis-Monaghan et al. | .. 257/507 |
| 2006/0008994 A1* | 1/2006 | Son et al. | ...... 438/270 |
| 2007/0120218 A1* | 5/2007 | Hsu et al. | ...... 257/529 |
| 2008/0185678 A1* | 8/2008 | Kitajima | ...... 257/529 |
| 2011/0266637 A1 | 11/2011 | Lee et al. | |

FOREIGN PATENT DOCUMENTS

JP 05-198747 6/1993

* cited by examiner

*Primary Examiner* — Fernando L Toledo
*Assistant Examiner* — Lawrence-Linh T Nguyen
(74) *Attorney, Agent, or Firm* — Howard M. Cohn; Matthew C. Zehrer

(57) ABSTRACT

A semiconductor structure providing a precision resistive element and method of fabrication is disclosed. Polysilicon is embedded in a silicon substrate. The polysilicon may be doped to control the resistance. Embodiments may include resistors, eFuses, and silicon-on-insulator structures. Some embodiments may include non-rectangular cross sections.

7 Claims, 10 Drawing Sheets

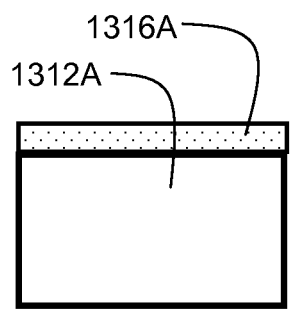 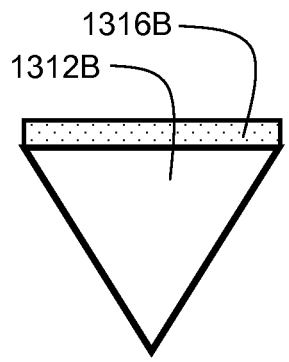 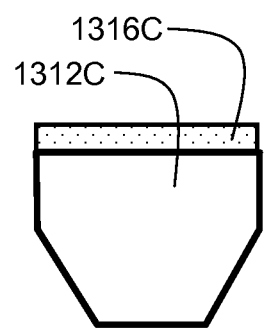
FIG. 13A        FIG. 13B        FIG. 13C
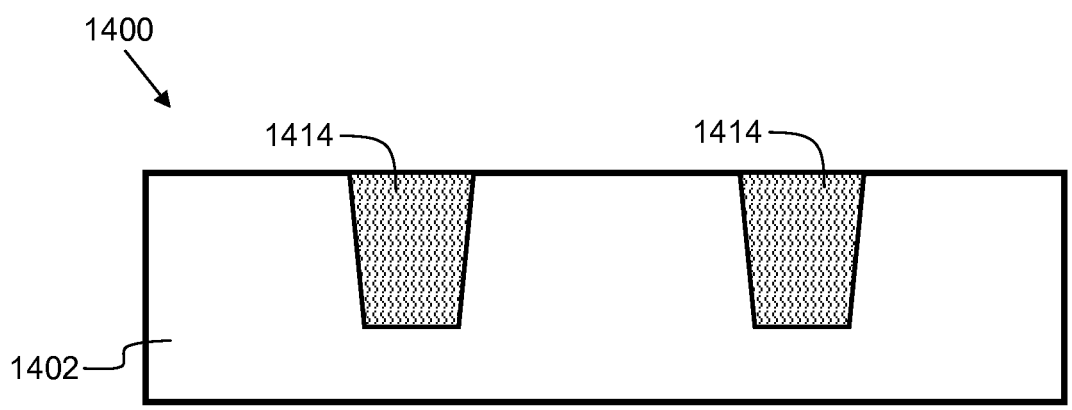
FIG. 14

PLANAR POLYSILICON REGIONS FOR PRECISION RESISTORS AND ELECTRICAL FUSES AND METHOD OF FABRICATION

FIELD OF THE INVENTION

The present invention relates generally to semiconductor fabrication, and more particularly, to formation of precision resistors and electrical fuses.

BACKGROUND OF THE INVENTION

In conventional integrated circuit technology, it is known to provide a layer of polysilicon on top of a thick field oxide or shallow trench isolation (STI) as a substrate for building electrical components such as polysilicon resistors, electrical fuses (eFuse) and thin film transistors (TFTs). Precision resistors are used extensively in analog and mixed signal circuits including current mirrors, analog-to-digital and digital-to-analog converters and switched capacitor filters. Polysilicon eFuses are cheap and efficient one-time-programmable devices available in traditional semiconductor process technologies. The aforementioned polysilicon layer is typically the same polysilicon used to form the gate electrode of the field effect transistor (FET).

However, there are drawbacks to forming electrical devices on top of the field oxide or STI using the same material layer as the FET gate. In particular, the advent of the metal gate field effect transistor has created challenges for fabrication of polysilicon resistive elements, such as a precision resistor. Various factors, such as reduced gate height, metal gates, High-K dielectrics, and additional mask requirements complicate the process. In particular, the metal gates used in advanced integrated circuit FETs are often not suitable for precision resistor or fuse applications because the resistance of a metal cannot easily be tuned to specific values. Therefore, it is desirable to have an improved structure and method for fabrication of precision resistive elements comprised of polysilicon.

Electronic fuses, also known as eFuses, are a special case of a resistive element. Analogously, polysilicon eFuse implementation with reduced gate height becomes challenging due to difficulty in maintaining optimal thicknesses of silicided and unsilicided regions. Alternate implementations of eFuse in bulk substrate have been proposed. Bulk substrate implementation has several drawbacks, such as; (a) insufficient difference in fuse resistance between programmed and unprogrammed states; and (b) heat loss through conductive substrates makes it difficult to maintain temperature gradient across the fuse during programming and thus much higher voltages are required. Thus, it is desirable to have an improved structure and method for fabrication of eFuse devices.

SUMMARY

In one embodiment, a method of fabricating a resistive element in a semiconductor substrate is provided. The method comprises forming a recess in the semiconductor substrate, forming an insulator layer in the recess, forming a polysilicon region in the recess, and planarizing the polysilicon region.

In another embodiment, a method of fabricating a resistive element in a silicon-on-insulator semiconductor structure is provided. In this method, the silicon-on-insulator semiconductor structure comprises a silicon layer disposed on a buried oxide layer. The method comprises forming a recess in the semiconductor structure, with a recess depth different than the thickness of the silicon layer, forming a polysilicon region in the recess; and planarizing the polysilicon layer.

In another embodiment, a semiconductor structure is provided. The semiconductor structure comprises a silicon layer, a polysilicon region disposed within the silicon layer and planar to the top of the silicon layer, a first insulator disposed underneath the polysilicon region, the first insulator having a depth, and a second insulator disposed adjacent to the polysilicon region, the second insulator having a width, wherein the depth is unequal to the width.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
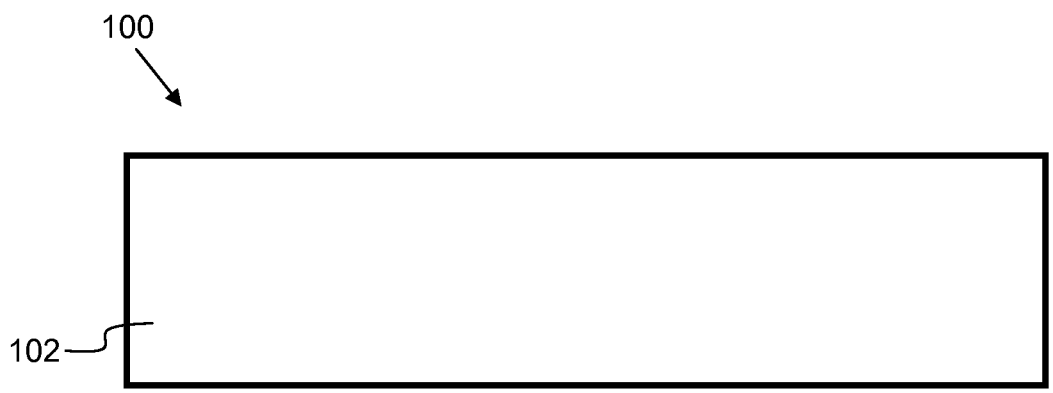

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a starting point for an embodiment of the present invention.

Figure 2:
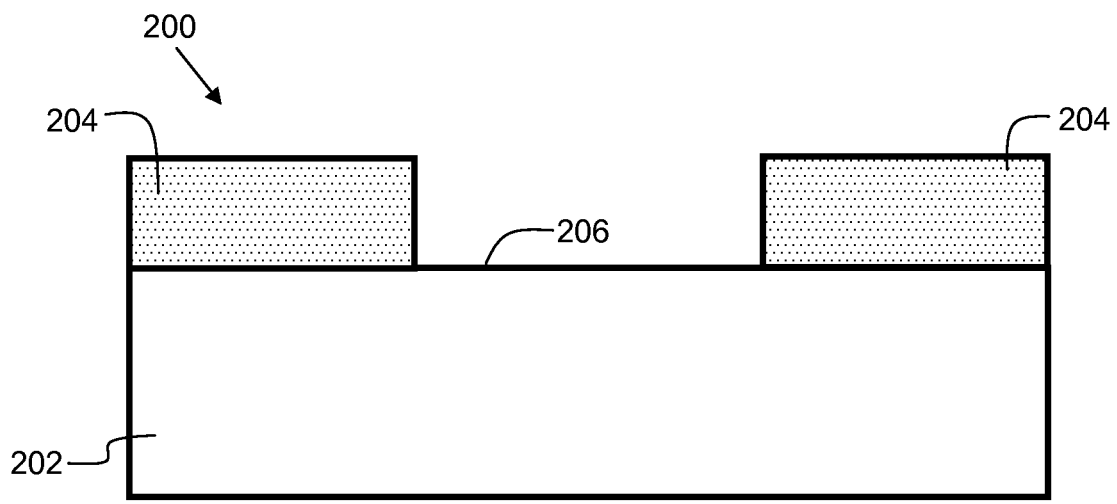

FIG. 2 shows a subsequent process step of applying a mask to the substrate.

Figure 3:
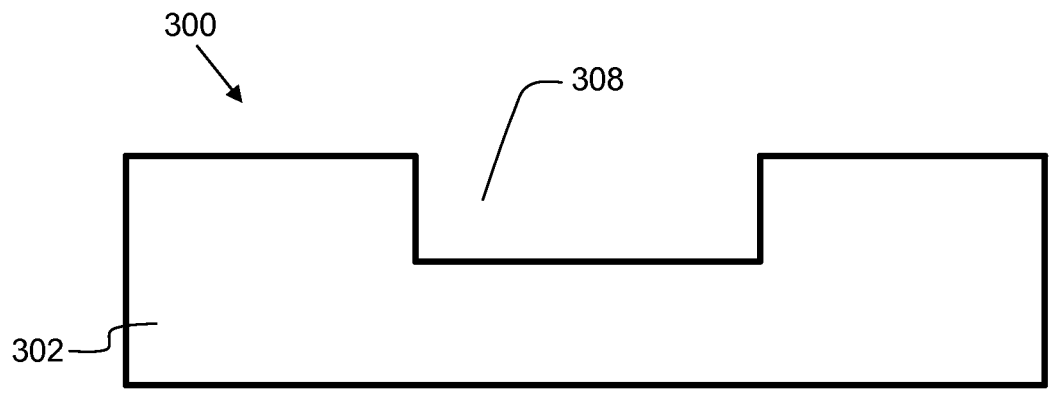

FIG. 3 shows a subsequent process step of forming a recess.

Figure 4:
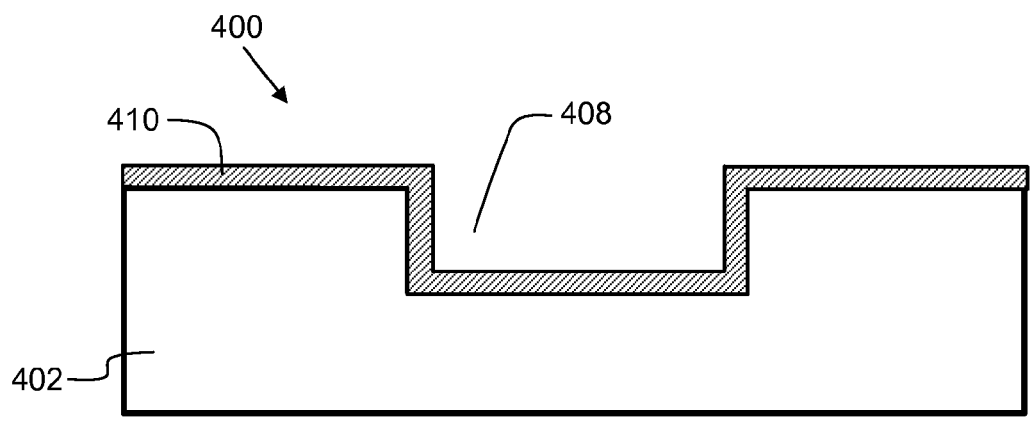

FIG. 4 shows a subsequent process step of forming a first insulator.

Figure 5:
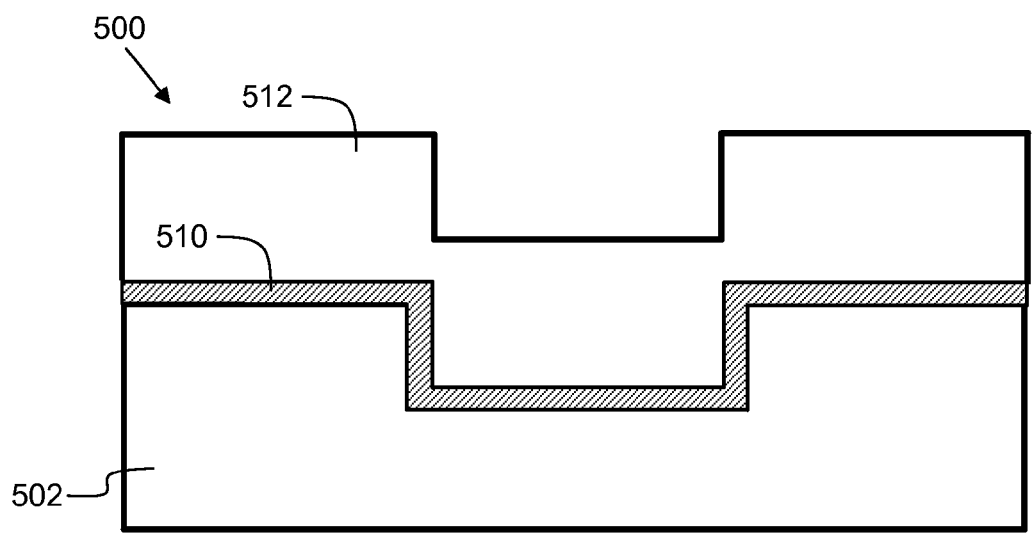

FIG. 5 shows a subsequent process step of depositing polysilicon.

Figure 6:
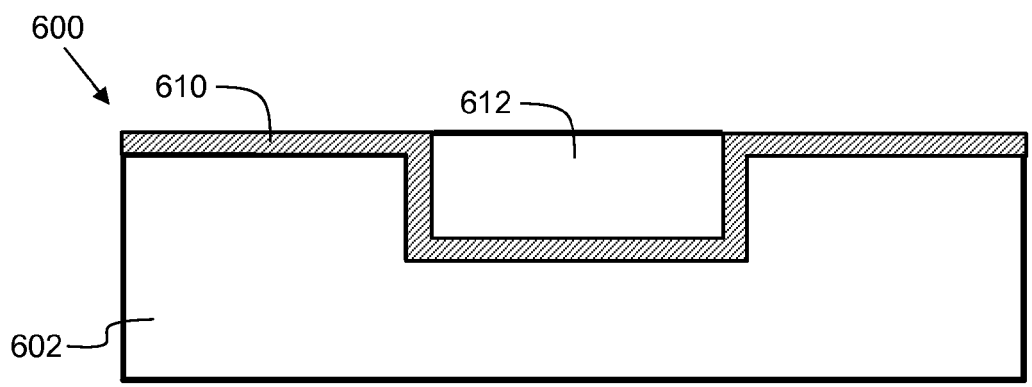

FIG. 6 shows a subsequent process step of planarization.

Figure 7:
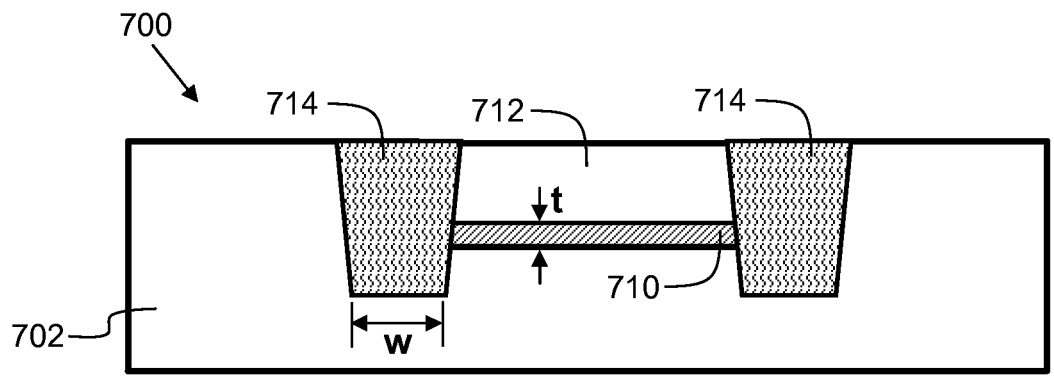

FIG. 7 shows a subsequent process step of forming an isolation region.

Figure 8:
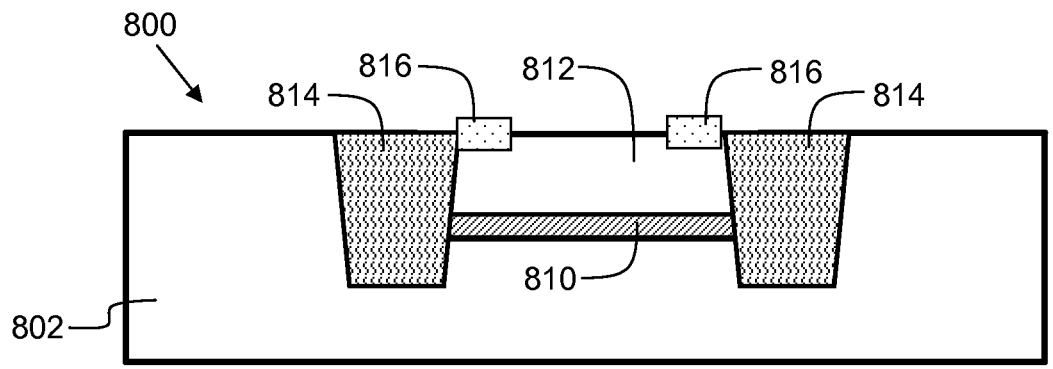

FIG. 8 shows a subsequent process step of forming silicide regions.

Figure 9:
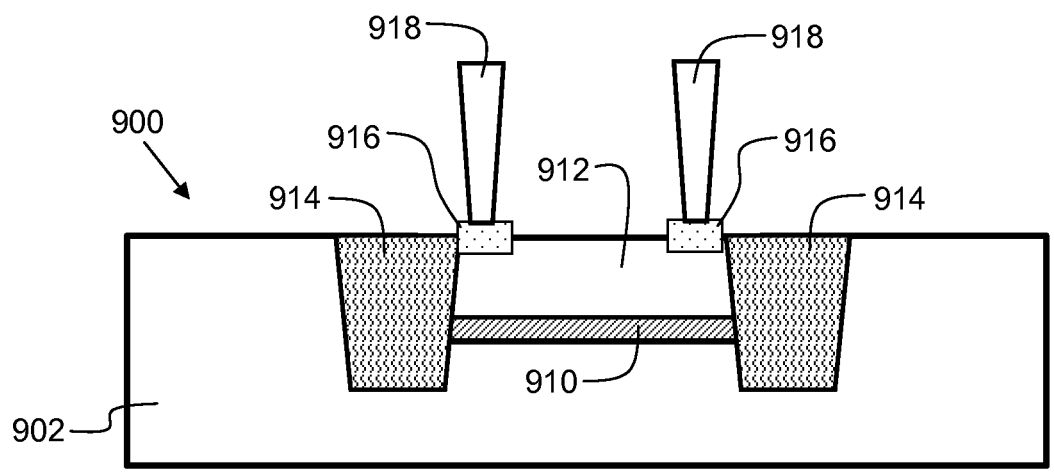

FIG. 9 shows a subsequent process step of forming contacts.

Figure 10:
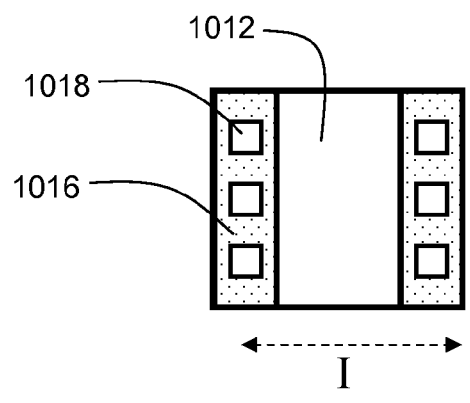

FIG. 10 shows a top-down view of the embodiment of FIG. 9.

Figure 11:
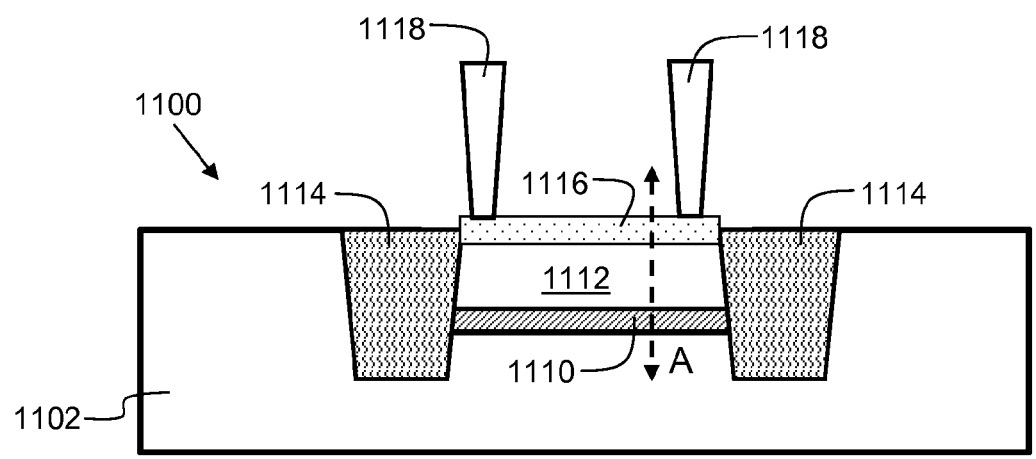

FIG. 11 shows process steps of forming silicide regions in an alternative embodiment.

Figure 12:
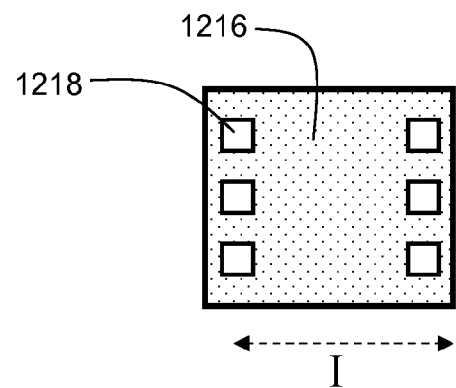

FIG. 12 shows a top-down view of the embodiment of FIG. 11.

FIGS. 13A-13C show polysilicon cross sections of embodiments of the present invention.

FIG. 14 shows a starting point for an alternative embodiment of the present invention.

Figure 15:
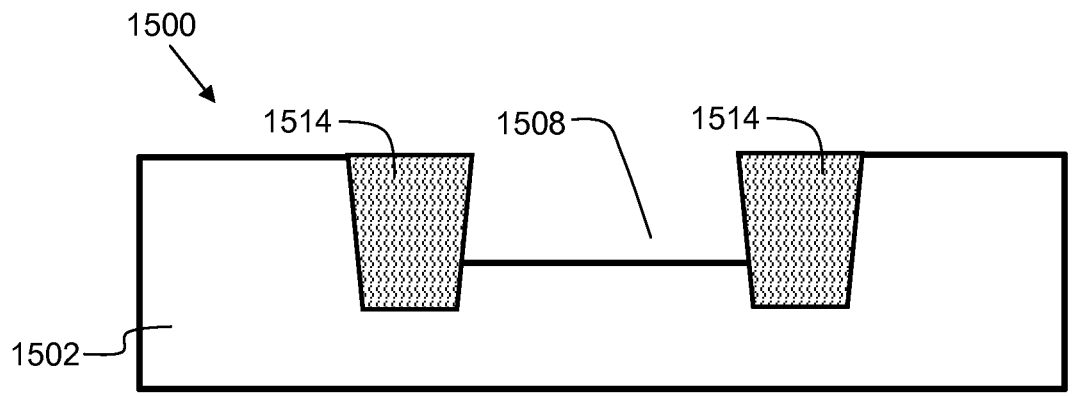

FIG. 15 shows a subsequent process step of forming a recess.

Figure 16:
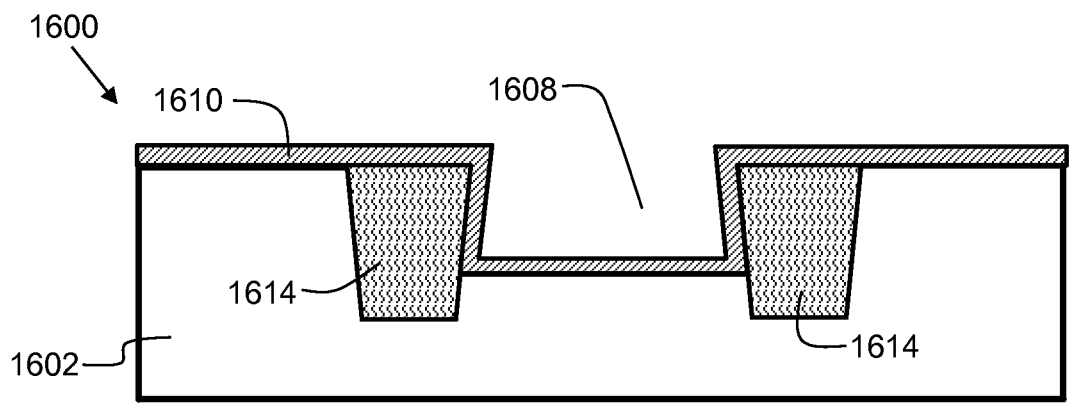

FIG. 16 shows a subsequent process step of forming a first insulator.

Figure 17:
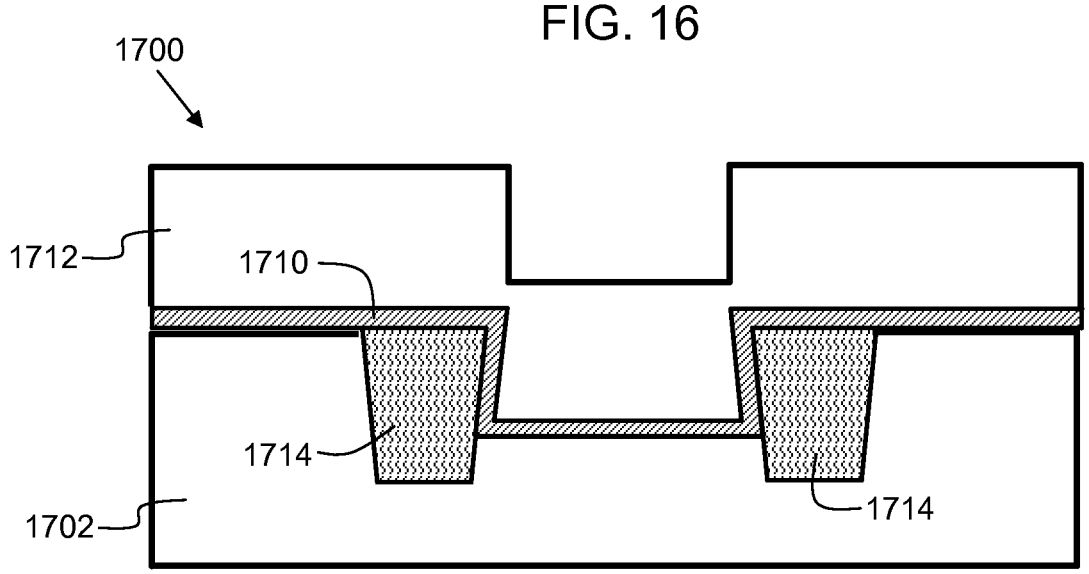

FIG. 17 shows a subsequent process step of depositing polysilicon.

Figure 18:
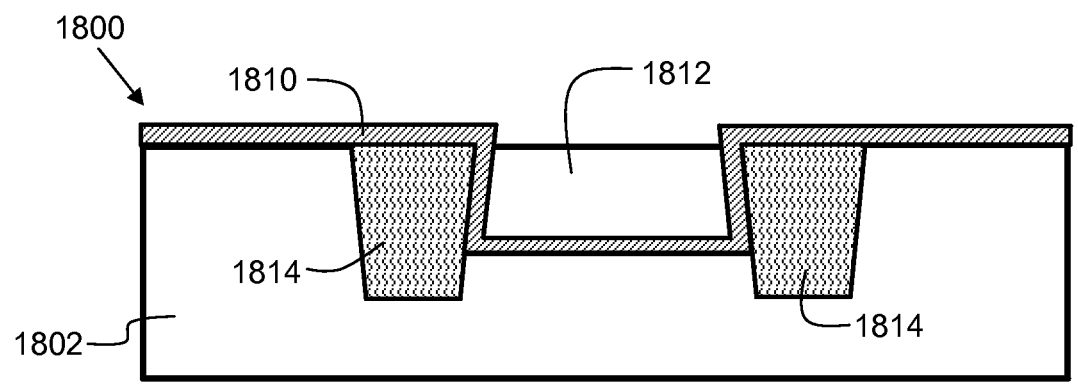

FIG. 18 shows a subsequent process step of planarization.

Figure 19:
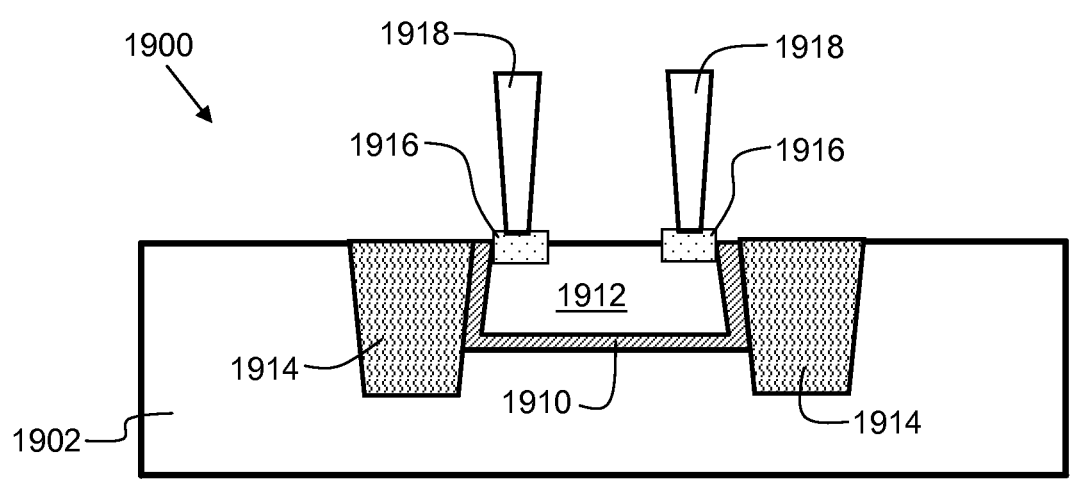

FIG. 19 shows subsequent process steps of silicide and contact formation.

Figure 20:
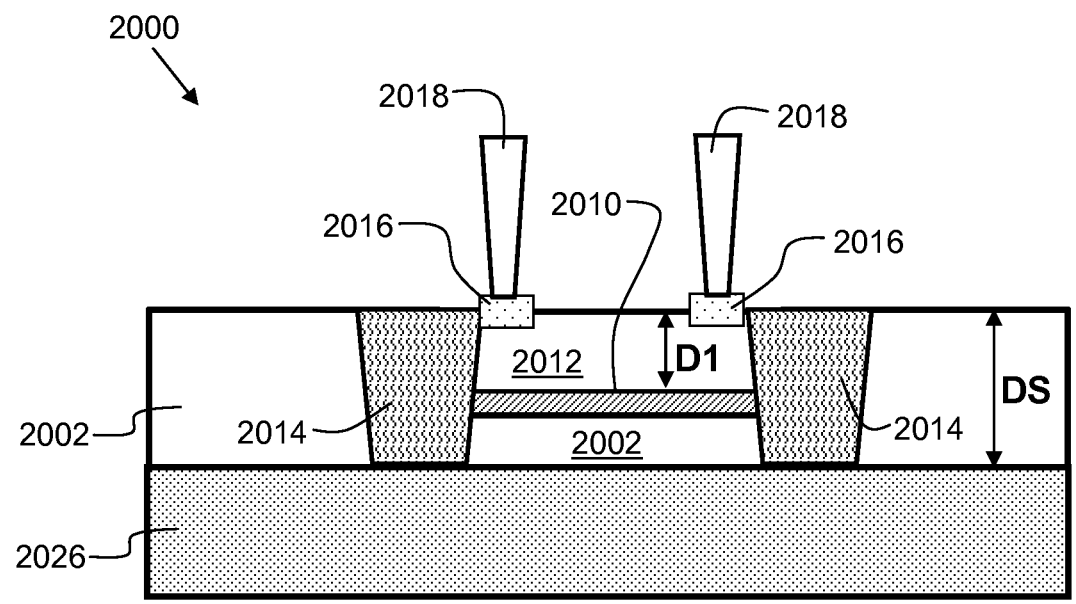

FIG. 20 shows an alternative embodiment of the present invention.

Figure 21:
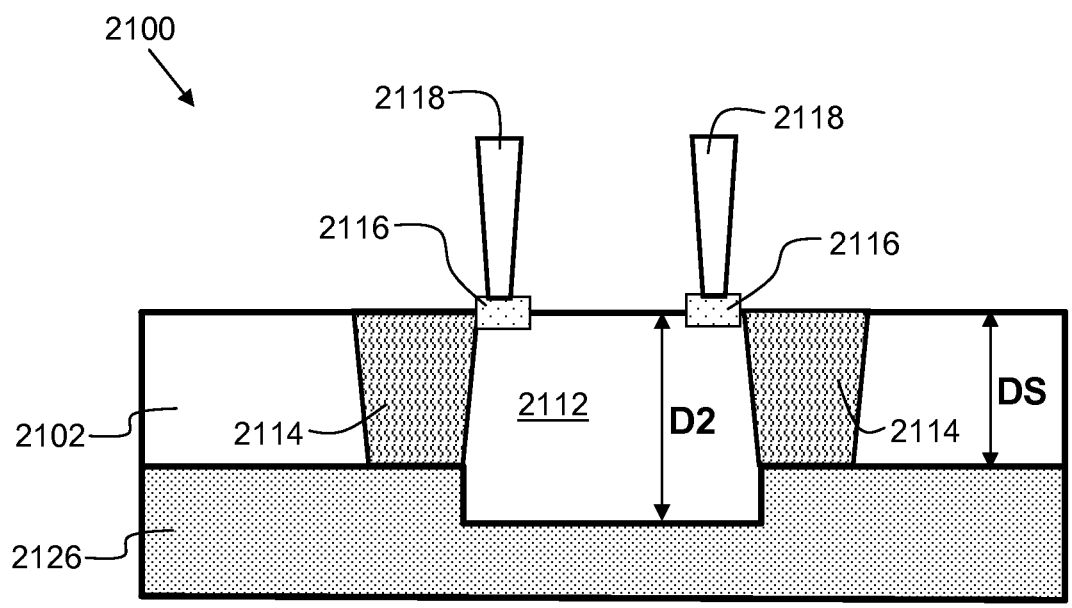

FIG. 21 shows another alternative embodiment of the present invention.

Figure 22:
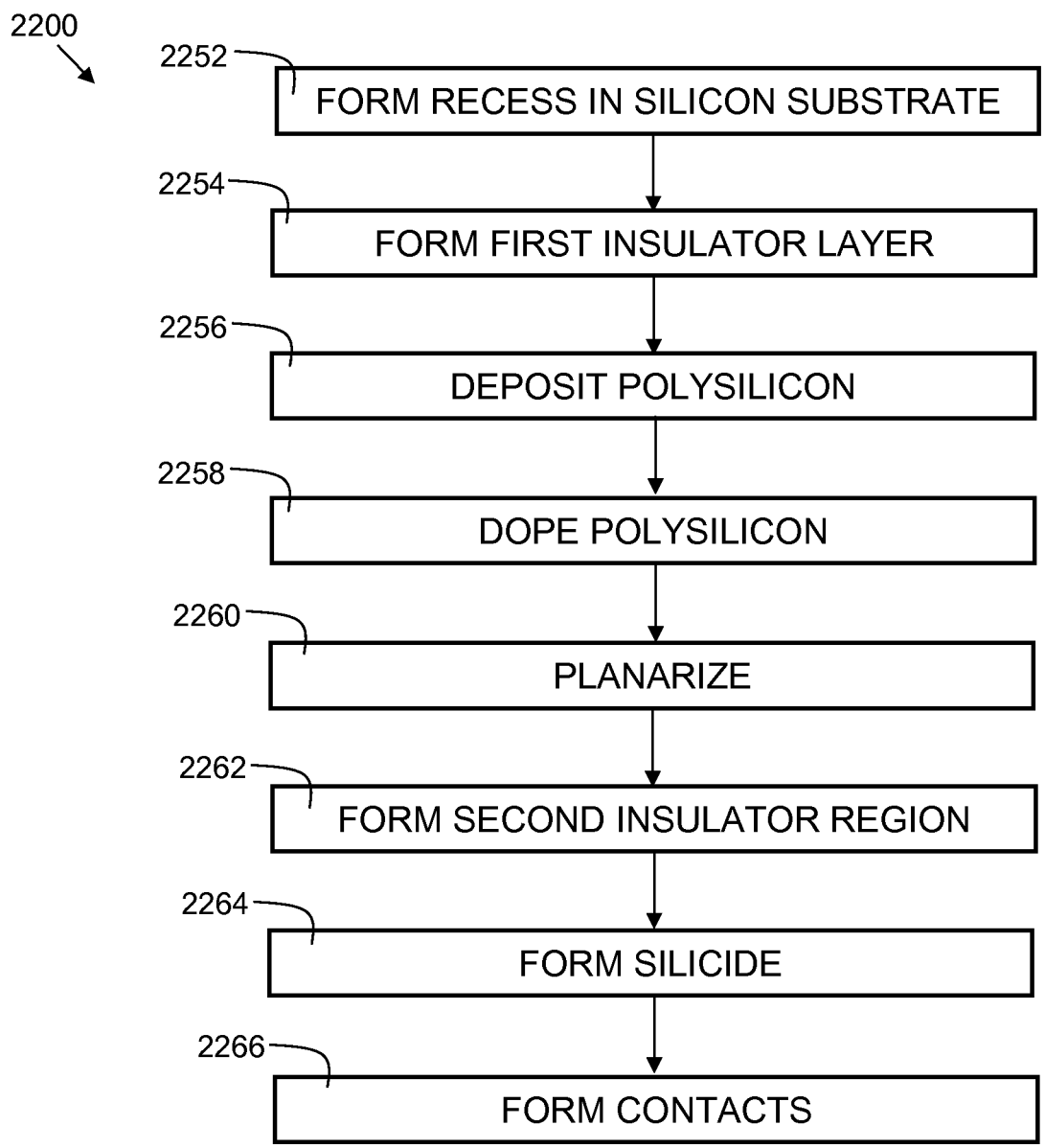

FIG. 22 shows a flowchart for process steps in accordance with an embodiment of the present invention.

Figure 23:
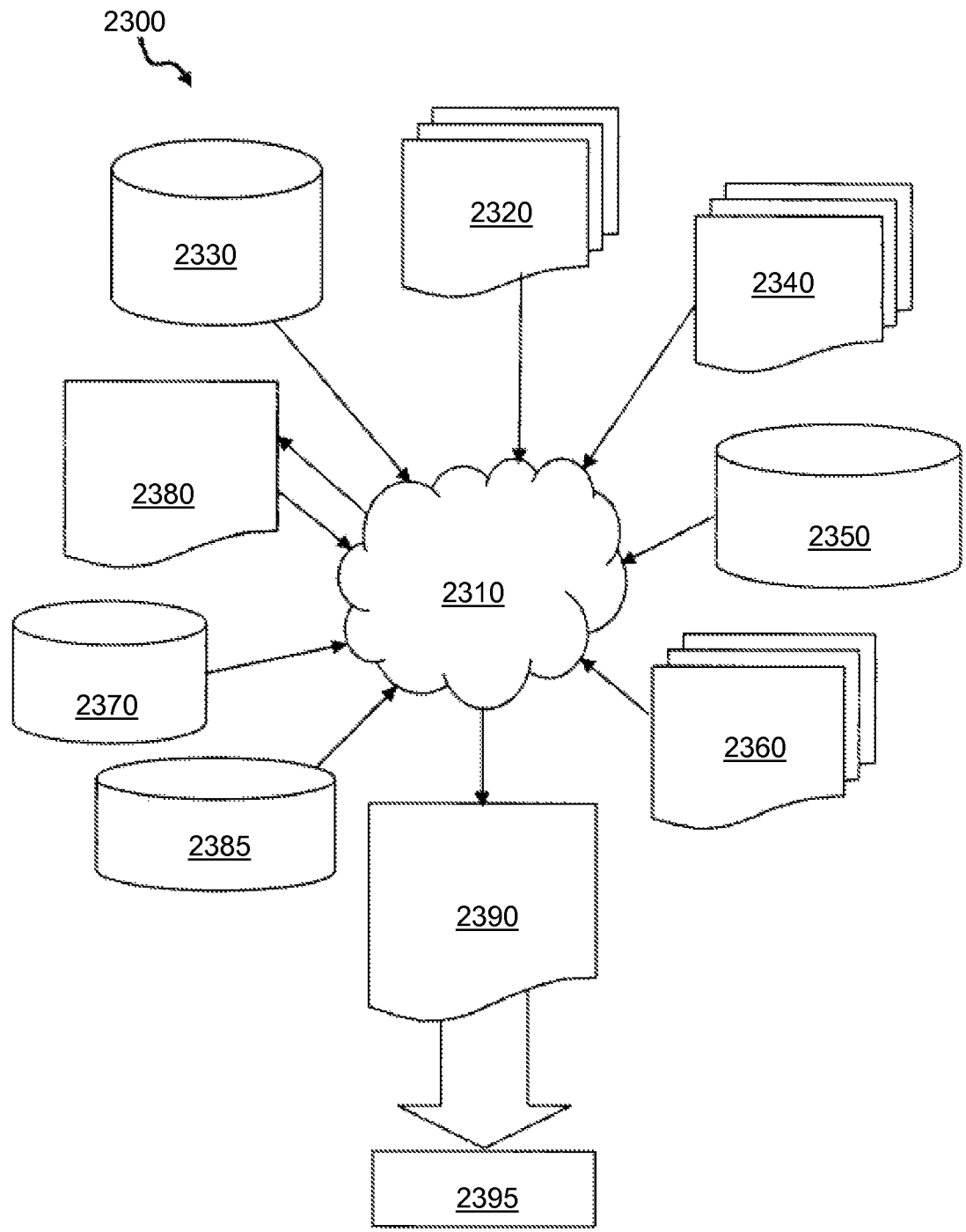

FIG. 23 shows a block diagram of an exemplary design flow.

DETAILED DESCRIPTION

FIG. 1 shows a semiconductor structure 100 at a starting point for an embodiment of the present invention. Semiconductor structure 100 comprises single crystal silicon substrate 102. The initial substrate may also be a layer in a silicon-on-insulator (SOI) structure. The initial substrate may contain other films, such as insulators, in addition to the substrate.

FIG. 2 shows a semiconductor structure 200 at a subsequent processing step of applying a mask 204 to the substrate 202. As stated previously, similar elements may be referred to by similar numbers in various figures of the drawing, in which case typically the last two significant digits may be the same, the most significant digit being the number of the drawing figure. For example, substrate 202 of FIG. 2 is similar to substrate 102 of FIG. 1. The mask 204 may be comprised of photoresist and applied by industry-standard lithographic methods. The pattern of the mask 204 is such that an open area 206 exists where the substrate 202 is not covered by the mask.

FIG. 3 shows a semiconductor structure 300 at a subsequent process step of forming a recess 308 in the substrate 302. In one embodiment, the recess 308 is formed by performing a reactive ion etch (RIE). In another embodiment, the recess 308 is formed by aqueous etching. In one embodiment, the depth of the recess 308 ranges from about 10 nanometers to about 200 nanometers.

FIG. 4 shows a semiconductor structure 400 at a subsequent process step of forming a first insulator 410. The first insulator 410 may be comprised of silicon oxide, silicon nitride, or other suitable material. In one embodiment, the first insulator 410 is deposited via chemical vapor deposition. In another embodiment, the first insulator 410 is deposited via atomic layer deposition. In one embodiment, the first insulator 410 has a thickness ranging from about 2 nanometers to about 200 nanometers. In yet another embodiment, a high-K dielectric (e.g. K>9), such as hafnium oxide, is used for first insulator 410.

FIG. 5 shows a semiconductor structure 500 at a subsequent process step of depositing polysilicon 512. In one embodiment, the polysilicon 512 is deposited via chemical vapor deposition. The polysilicon 512 may be doped to provide appropriate resistance. Dopants may include, but are not limited to, arsenic, phosphorous, and boron. In one embodiment, the dopant concentration ranges from about 1E17 atoms/cm3 to about 1E21 atoms/cm3. In one embodiment, the doping is provided in-situ during the deposition, by ion implantation, plasma doping or diffusion from a precursor. Unsilicided polysilicon resistance can be tuned using doping levels. Also, it is more advantageous to use polysilicon rather than single crystal silicon to form resistors because the grain boundaries of polysilicon allow for fast dopant diffusion and uniform doping levels throughout the polysilicon. Additionally, the grain boundaries within the polysilicon provide a favorable temperature coefficient of resistance (TCR).

FIG. 6 shows a semiconductor structure 600 at a subsequent process step of planarization. In one embodiment, the planarization is performed via a chemical mechanical polish (CMP) process. The result is polysilicon region 612 which is embedded in the single crystal silicon substrate 602. The first insulator 610 may serve as an etch stop layer.

FIG. 7 shows a semiconductor structure 700 at a subsequent process step of forming a second insulator of shallow trench isolation (STI) regions 714 adjacent to polysilicon region 712. The first insulator is removed from the top of the substrate 702 (compare with 610 of FIG. 6). A portion of first insulator 710 remains disposed underneath polysilicon region 712. The STI regions 714 may be formed by an industry-standard process of etching cavities and filling the cavities with an insulator such as oxide or nitride. The thickness t of the first insulator 710 may be unequal to the width w of the STI regions 714. The width w of the STI regions 714 may, in some embodiments, range from about 30 nanometers to about 500 micrometers. In contrast, the thickness t of first insulator 710 may have a thickness ranging from about 2 nanometers to about 200 nanometers. Hence, the first insulator 710 may be thinner or thicker than the width w of the STI regions 714. Furthermore, the first insulator 710 may be comprised of a different material than the STI regions 714. For example, in one embodiment, the STI region 714 is comprised of oxide, and the first insulator 710 is comprised of nitride (e.g. silicon nitride).

FIG. 8 shows a semiconductor structure 800 at a subsequent process step of forming silicide regions 816. Silicide is formed using industry standard techniques. Not shown is the use of industry standard patterned silicide blocking layers such as nitride or oxide which prevent the formation of silicide in desired regions. The silicide regions 816 are formed on the top surface of polysilicon region 812. In one embodiment, the silicide regions are comprised of nickel silicide. In another embodiment, the silicide regions 816 are comprised of cobalt silicide. Other silicide materials are possible.

FIG. 9 shows a semiconductor structure 900 at a subsequent process step of forming contacts 918. The contacts are disposed on the silicide regions 916, and serve to connect the resistive element (resistor or eFuse) to another layer within an integrated circuit. In one embodiment the contact material is tungsten or copper.

FIG. 10 shows a top-down view of the embodiment of FIG. 9. In this view, it can be seen that a plurality of contacts 1018 are disposed on silicide regions 1016 on two sides of the polysilicon region 1012. The current flows in the direction indicated by arrow I, through the resistive element.

FIG. 11 shows process steps of forming silicide regions in an alternative embodiment of the present invention. Semiconductor structure 1100 is similar to semiconductor structure 900, with the primary difference being that silicide region 1116 covers the entire polysilicon region (compare with 916 of FIG. 9).

FIG. 12 shows a top-down view of the embodiment of FIG. 11. Contacts 1218 are disposed on silicide region 1216. The current flows in the direction indicated by arrow I. In the case of an eFuse, the current flows until sufficient heat is created to form an open circuit, at which point, substantially no more current can flow through.

FIGS. 13A-13C show polysilicon cross sections of embodiments of the present invention. The cross sections are taken along line A of FIG. 11. FIG. 13A shows a rectangular polysilicon region 1312A covered with silicide region 1316A. FIG. 13B shows a triangular polysilicon region 1312B covered with silicide region 1316B. FIG. 13C shows a faceted polygon polysilicon region 1312C covered with silicide region 1316C. The cross sections of region 1312B and region 1312C may be performed using industry standard anisotropic etches which etch preferentially along certain semiconductor crystal planes, thus creating faceted trench regions.

FIG. 14 shows a semiconductor structure 1400 at a starting point for an alternative embodiment of the present invention. In this embodiment, STI regions 1414 are formed in single crystal silicon substrate 1402 prior to forming a cavity for the resistive polysilicon.

FIG. 15 shows a semiconductor structure 1500 at a subsequent process step of forming a recess 1508. The recess may be formed by using a mask (similar to 204 of FIG. 2) and performing an etch (e.g. a reactive ion etch) to form the recess 1508.

FIG. 16 shows a semiconductor structure 1600 at a subsequent process step of forming a first insulator 1610. The first insulator 1610 may be comprised of silicon oxide, silicon nitride, or other suitable material. In one embodiment, the first insulator 1610 is deposited via chemical vapor deposition. In another embodiment, the first insulator 1610 is deposited via atomic layer deposition. In one embodiment, the first insulator 1610 has a thickness ranging from about 2 nanometers to about 200 nanometers. In yet another embodiment, a high-K dielectric, such as hafnium oxide, is used for first insulator 1610.

FIG. 17 shows a semiconductor structure 1700 at a subsequent process step of depositing polysilicon 1712. In one embodiment, the polysilicon 1712 is deposited via chemical vapor deposition. The polysilicon 1712 may be doped to provide appropriate resistance. Dopants may include, but are not limited to, arsenic, phosphorous, and boron. In one embodiment, the dopant concentration ranges from about 1E17 atoms/cm3 to about 1E21 atoms/cm3.

FIG. 18 shows a semiconductor structure 1800 at a subsequent process step of planarization. In one embodiment, the planarization is performed via a chemical mechanical polish (CMP) process. The first insulator 1810 may serve as an etch stop layer.

FIG. 19 shows a semiconductor structure 1900 after subsequent process steps of silicide and contact formation. Silicide regions 1916 are formed on the surface of polysilicon region 1912. Contacts 1918 are then formed on top of the silicide regions 1916. In one embodiment, the contacts 1918 are comprised of tungsten. In another embodiment, the contacts 1918 are comprised of copper.

FIG. 20 shows an alternative embodiment of the present invention. Semiconductor structure 2000 shows a silicon-on-insulator (SOI) embodiment with a shallow recess. In semiconductor structure 2000, a single crystal silicon substrate 2002 is disposed on an insulator layer 2026. The insulator layer 2026 may be a buried oxide (BOX) layer. The polysilicon region 2012 has a depth D1 which is less than the thickness DS of the silicon substrate 2002. In one embodiment, the thickness DS ranges from about 10 nanometers to about 200 nanometers, and the depth D1 ranges from about 5 nanometers to about 195 nanometers. With this embodiment, the depth D1 is adjusted according to design preferences for the resistive element, and is not directly tied to the substrate depth DS, hence giving more flexibility to the design of the resistive element.

FIG. 21 shows another alternative embodiment of the present invention. Semiconductor structure 2100 shows a silicon-on-insulator (SOI) embodiment with a deep recess. In semiconductor structure 2100, a single crystal silicon substrate 2102 is disposed on an insulator layer 2126. The insulator layer 2126 may be a buried oxide (BOX) layer. The polysilicon region 2112 has a depth D2 which is greater than the thickness DS of the silicon substrate 2102. In one embodiment, the thickness DS ranges from about 10 nanometers to about 200 nanometers, and the depth D2 ranges from about 10 nanometers to about 300 nanometers. With this embodiment, the depth D2 is adjusted according to design preferences for the resistive element, and is not directly tied to the substrate depth DS, hence give more flexibility to the design of the resistive element.

FIG. 22 shows a flowchart 2200 for process steps in accordance with an embodiment of the present invention. In process step 2252, a recess is formed in a silicon substrate. This may be performed with a reactive ion etch process (see 308 of FIG. 3). In process step 2254 a first insulator layer is formed (see 410 of FIG. 4). The first insulator layer may be comprised of grown silicon oxide, or a deposited material such as silicon nitride or silicon oxide. Optionally, a high-K dielectric such as hafnium oxide may be used. The first insulator layer may be deposited via any suitable method, including, but not limited to, chemical vapor deposition or atomic layer deposition, or grown by any suitable method such as thermal oxidation or plasma oxidation.

In process step 2256, polysilicon is deposited into the recess (see 512 of FIG. 5). The polysilicon may be deposited via chemical vapor deposition. In optional process step 2258, the polysilicon may be doped to provide a desired resistance level. The dopants provided in process step 2258 may be implanted, or provided in situ during the polysilicon deposition process. Dopants may include, but are not limited to, arsenic, phosphorous, and boron. In process step 2260, the polysilicon region is planarized, resulting in the remaining portion of the polysilicon region being embedded in, and planar with the top of the silicon substrate (see 612 of FIG. 6). The planarizing may be performed via a chemical mechanical polish (CMP) process.

In process step 2262 a second insulator region is formed. The second insulator region may comprise STI regions (see 714 of FIG. 7). In process step 2264 silicide is formed on the top of the polysilicon region (see 916 of FIG. 9, or 1116 of FIG. 11). In process step 2266, contacts are formed on the silicide regions (see 918 of FIG. 9). From this point forward and between steps 2262 and 2264, industry-standard semiconductor fabrication techniques may be used to complete the integrated circuit. Note that while flowchart 2200 shows steps in a particular order, embodiments of the present invention may perform the steps in a different order. For example, the second insulator regions (step 2262) may be formed prior to forming the recess in the substrate (step 2252). In some embodiments, such as the eFuse embodiments, the FEOL part of the integration may occur before or after the resistor/eFuse formation.

FIG. 23 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-22. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-22. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1-22 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include using a variety of inputs; for example, inputs from library elements 2330 which may house a set of commonly used elements, circuits, and devices, including models, layouts, and symbolic representations, for a given manufacturing technology (e.g., different technology nodes, 32 nm, 45 nm, 90 nm, etc.), design specifications 2340, characterization data 2350, verification data 2360, design rules 2370, and test data files 2385 (which may include test patterns and other testing information). Design process 2310 may further include, for example, standard circuit design processes such as timing analysis, verification, design rule checking, place and route operations, etc. One of ordinary skill in the art of integrated circuit design can appreciate the extent of possible electronic design automation tools and applications used in design process 2310 without deviating from the scope and spirit of the invention. The design structure of the invention is not limited to any specific design flow.

Design process 2310 preferably translates an embodiment of the invention as shown in FIGS. 1-22, along with any additional integrated circuit design or data (if applicable), into a second design structure 2390. Design structure 2390 resides on a storage medium in a data format used for the exchange of layout data of integrated circuits (e.g. information stored in a GDSII (GDS2), GL1, OASIS, or any other suitable format for storing such design structures). Design structure 2390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-22. Design structure 2390 may then proceed to a stage 2395 where, for example, design structure 2390: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a resistive element in a semiconductor substrate, comprising:

forming a first shallow trench isolation region and a second shallow trench isolation region in the silicon layer;

forming a recess in the semiconductor substrate, disposed between the first shallow trench isolation region and the second shallow trench isolation region, wherein the recess has a depth less than a depth of the first and second shallow trench isolation region;

forming an insulator layer in the recess, and on exposed sidewall portions of the first shallow trench isolation region and the second shallow trench isolation region;

forming a polysilicon region in the recess;

planarizing the polysilicon region;

forming one or more silicide regions on the polysilicon region; and forming a plurality of contacts disposed on the one or more silicide regions.

2. The method of claim 1, wherein planarizing the polysilicon region is performed via a chemical mechanical polish process.

3. The method of claim 1, wherein forming an insulator layer in the recess comprises depositing a layer of silicon nitride.

4. The method of claim 1, wherein forming an insulator layer in the recess comprises forming a layer of silicon oxide.

5. The method of claim 1, wherein forming an insulator layer in the recess comprises forming a layer of High-K dielectric.

6. The method of claim 1, further comprising doping the polysilicon region with a dopant selected from the group consisting of arsenic, phosphorous, and boron.

7. A method of fabricating a resistive element in a silicon-on-insulator semiconductor structure, wherein the silicon-on-insulator semiconductor structure comprises a silicon layer disposed on a buried oxide layer, the method comprising:

forming a first shallow trench isolation region and a second shallow trench isolation region in the silicon layer, and in contact with a top surface of the buried oxide layer;

forming a recess in the semiconductor structure between the first shallow trench isolation region and the second shallow trench isolation region, wherein the depth of the recess is larger than the thickness of the silicon layer;

forming a polysilicon region in the recess, wherein the polysilicon region extends below a bottom surface of the first shallow trench isolation region and second shallow trench isolation region;

planarizing the polysilicon layer;

forming one or more silicide regions on the polysilicon region; and forming a plurality of contacts disposed on the one or more silicide regions.

* * * * *